(12) United States Patent
Nonis et al.

(10) Patent No.: US 9,148,101 B2
(45) Date of Patent: *Sep. 29, 2015

(54) LDO WITH DISTRIBUTED OUTPUT DEVICE

(71) Applicant: INFINEON TECHNOLOGIES AG, Neubiberg (DE)

(72) Inventors: Roberto Nonis, Warmbad-Villach (AT); Nicola Da Dalt, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/752,575

(22) Filed: Jan. 29, 2013

(65) Prior Publication Data

US 2013/0141158 A1 Jun. 6, 2013

Related U.S. Application Data

(63) Continuation of application No. 13/544,862, filed on Jul. 9, 2012, now Pat. No. 8,378,651, which is a continuation of application No. 12/418,479, filed on Apr. 3, 2009, now Pat. No. 8,217,635.

(51) Int. Cl.
| | | |
|---|---|---|
| *G05F 1/00* | (2006.01) | |
| *G05F 1/577* | (2006.01) | |
| *H03G 1/00* | (2006.01) | |
| *H03K 3/03* | (2006.01) | |
| *H03K 3/354* | (2006.01) | |

(52) U.S. Cl.
CPC ........... *H03G 1/0005* (2013.01); *H03K 3/0315* (2013.01); *H03K 3/354* (2013.01); *Y10T 307/406* (2015.04)

(58) Field of Classification Search
USPC .......................................... 323/273, 274, 314
See application file for complete search history.

(56) References Cited

U.S. PATENT DOCUMENTS

| | | | | |
|---|---|---|---|---|
| 5,012,178 | A * | 4/1991 | Weiss et al. | 323/269 |
| 6,414,537 | B1 * | 7/2002 | Smith | 327/540 |
| 6,891,357 | B2 * | 5/2005 | Camara et al. | 323/316 |
| 7,109,690 | B2 * | 9/2006 | Ke et al. | 323/273 |
| 7,190,936 | B1 * | 3/2007 | Teo et al. | 455/127.1 |
| 7,215,186 | B2 * | 5/2007 | Whyte et al. | 327/543 |
| 7,323,853 | B2 * | 1/2008 | Tang et al. | 323/280 |
| 7,973,521 | B2 * | 7/2011 | Chen et al. | 323/273 |
| 8,217,635 | B2 * | 7/2012 | Nonis et al. | 323/273 |
| 8,378,651 | B2 * | 2/2013 | Nonis et al. | 323/273 |
| 2002/0130646 | A1 * | 9/2002 | Zadeh et al. | 323/275 |
| 2004/0046532 | A1 | 3/2004 | Menegoli et al. | |
| 2006/0214651 | A1 * | 9/2006 | Ke et al. | 323/311 |
| 2007/0097574 | A1 | 5/2007 | Mahin et al. | |
| 2007/0278861 | A1 | 12/2007 | Lou et al. | |

OTHER PUBLICATIONS

Prosecution History from U.S. Appl. No. 12/418,479, filed Apr. 3, 2009, including the following documents and the associated cited documents and content of said documents, May 31, 2011 Non-Final Rejection, Dec. 9, 2011 Final Rejection, Mar. 15, 2012 Notice of Allowance and Fees Due (PTOL-85), Mar. 15, 2012 Examiner initiated interview summary (PTOL-413B).

* cited by examiner

*Primary Examiner* — Emily P Pham
(74) *Attorney, Agent, or Firm* — SpryIP, LLC

(57) ABSTRACT

At least one implementation relates to a method that includes receiving a bias voltage provided by a low-dropout voltage regulator (LDO) error amplifier; supplying a feedback voltage to the LDO error amplifier; supplying a power signal to a load; and providing a control signal to enable or disable the load and enable or disable the LDO error amplifier.

19 Claims, 3 Drawing Sheets

LDO WITH DISTRIBUTED OUTPUT DEVICE

RELATED APPLICATIONS

This application is a Continuation of co-pending application Ser. No. 13/544,862, which was filed on Jul. 9, 2012. The co-pending application Ser. No. 13/544,862 application is a Continuation of application Ser. No. 12/418,479, which was filed on Apr. 3, 2009 and has now issued as U.S. Pat. No. 8,217,635. The entire contents of the application Ser. Nos. 13/544,862 and 12/418,479 are hereby incorporated herein by reference.

BACKGROUND

Digitally Controlled Ring Oscillators are a type of controlled oscillator that can be implemented in a number of different ways. One common implementation includes one or more stages of tri-state inverters connected in parallel. Each stage of inverters is comprised of an odd number of tri-state inverters connected in a loop, with the output of one inverter feeding the input of the next inverter. The looped connection of the odd number of inverters creates oscillation of the inverters between two logical states at a frequency that may be adjusted by means of a digital input word, using different techniques.

In one example, the oscillation frequency may be adjusted by switching on or off one or more of the tri-state inverters connected in one or more stages of the ring. Sets of parallel-connected tri-state inverters or stages of inverters may be activated or cut out as a group to adjust the oscillation frequency in steps.

Tri-state inverters have generally been comprised of a chain of four Metal-Oxide Semiconductor (MOS) devices connected in series: two p-type Metal-Oxide Semiconductor (PMOS) devices ahead of two n-type Metal-Oxide Semiconductor (NMOS) devices. Generally, the two MOS devices in the center of the chain are the "core" devices, functioning as an inverter, while the two MOS devices on the ends perform switching functions, either energizing or cutting out the core inverter devices.

It is usually desirable that the supply of such tri-state inverters is regulated for power supply noise rejection. As a consequence, when implemented as part of an oscillator circuit, the core inverter of a tri-state inverter is generally powered by a series of two PMOS devices, one constituting the output device of a low-drop voltage regulator feeding the circuit, and the other constituting the upper enabling switch of the tri-state inverter.

Using the methods and apparatuses described below, the functions of voltage regulation and power switching can be implemented with only one device, thereby resulting in the core inverter of the tri-state inverter being powered by only one PMOS device.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

The invention is explained in more detail below using a plurality of exemplary implementations. Although various implementations and examples are discussed here and below, further implementations and examples are possible by combining the features and elements of individual ones.

Exemplary implementations of methods and apparatuses are disclosed for supplying independently switched, regulated power to a plurality of loads. In one example, an apparatus has an input terminal from which the apparatus receives a supply voltage from a power supply, and an output terminal from which the apparatus supplies regulated power to a load associated with the apparatus. The apparatus also has a second input terminal from which the apparatus receives a bias voltage from a low-dropout voltage regulator (LDO) error amplifier, and a second output terminal from which the apparatus supplies a feedback voltage to the LDO error amplifier. Further, the apparatus has a regulating portion that regulates the power supplied to the associated load, and a switching portion that enables or disables the load from receiving the regulated power. The apparatus regulates the power supplied to the associated load using the regulating portion of the apparatus in conjunction with the bias voltage received from the LDO error amplifier. The bias voltage is adjusted for error correction by the LDO error amplifier based on the feedback voltage sent by the apparatus to the LDO error amplifier. Additionally, the apparatus enables or disables the load from receiving regulated power using the switching portion of the apparatus.

A plurality of Metal-Oxide Semiconductor (MOS) devices may control power supply regulation and switching functions for a plurality of associated loads. According to exemplary techniques, the methods and apparatuses allow for an increase in the supply current to each load (thereby increasing the maximum oscillation frequency, as current consumption is proportionate to frequency attained by the oscillator) without reducing power supply noise rejection or increasing the physical circuit area consumed. Circuit area consumed may be minimized and power supply noise rejection may be maximized. Further, for some implementations, the methods and apparatuses allow a reduced voltage drop between the chip supply and the effective regulated supply applied to the core portion of the load. As discussed below, the methods and apparatuses may be implemented in various situations that use an independently switched and regulated power supply.

Figure 1:
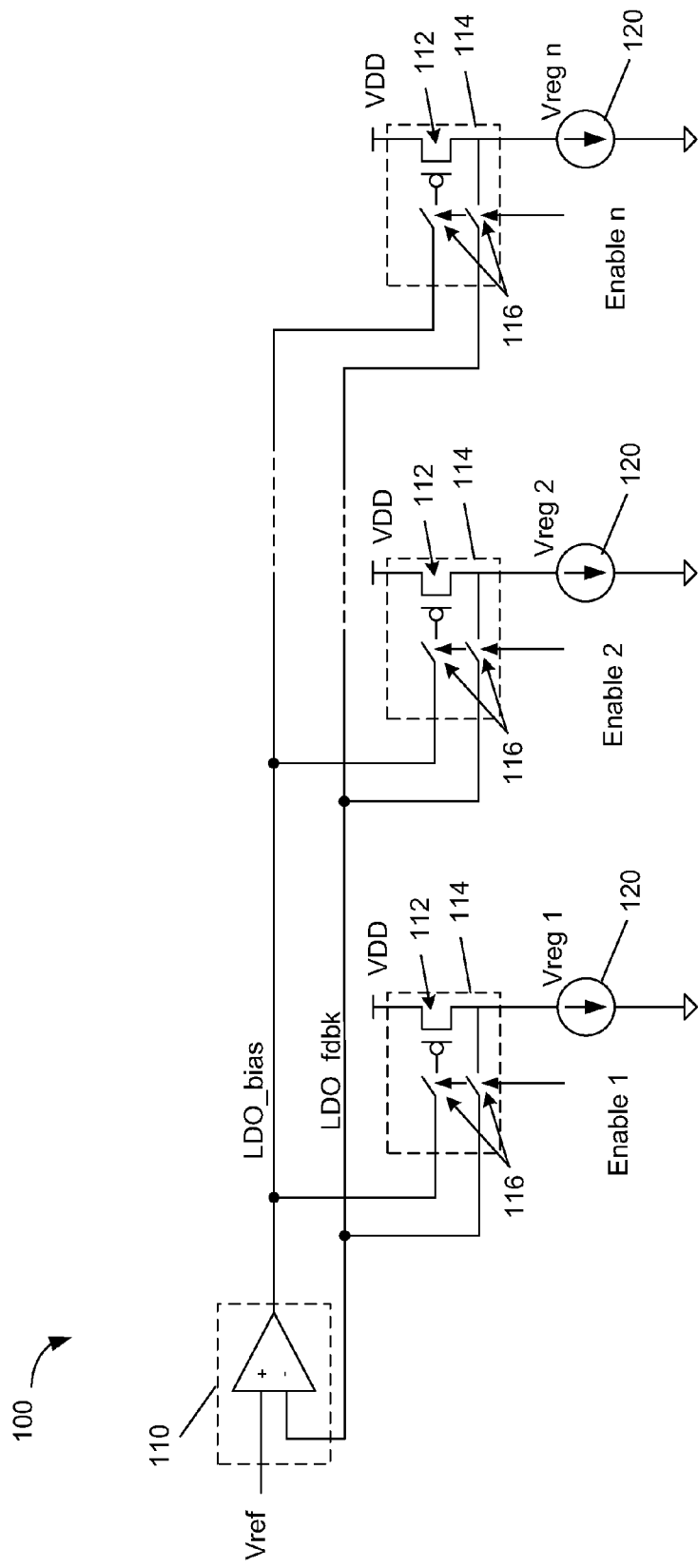
FIG. 1 shows a schematic illustration of an implementation of the apparatus and method according to the present disclosure.

FIG. 1 shows an example of an apparatus implemented in a power supply circuit 100. A plurality of power supply regulator output devices 114 regulate a power supply to a plurality of associated loads 120 as guided by a common bias voltage (LDO_bias) and a common feedback path (LDO_fdbk). Additionally, the regulator output devices 114 provide switching for the associated loads 120, enabling and disabling the loads individually. The independent loads 120 as illustrated in FIG. 1 are configured as current sinks. The configuration shown is only for convenience of discussion and is not intended as a limitation. Other types of loads may also be used as independent loads 120.

As shown in FIG. 1, the low-dropout (LDO) regulator error amplifier 110 receives a reference voltage on its non-inverting input, and outputs a bias voltage (LDO_bias). This bias voltage is received at the switched input of each of the regulator output devices 114, when the device 114 is enabled. A voltage value is produced at the output of each of the regulator output devices 114 when the device 114 is enabled, based on the value of the bias voltage (LDO_bias) received by the device 114. The voltage value (LDO_fdbk) at the output of each of the regulator output devices 114 is fed back into the inverting input of the LDO regulator error amplifier 110, also when the regulator output device 114 is enabled, to provide error correction feedback to the LDO regulator error amplifier 110. Thus, the voltage value (LDO_fdbk) at the output of each of the regulator output devices 114 comprises a power supply regulating function performed by the regulator output device 114. Each of the regulator output devices 114 share a common bias voltage (LDO_bias) and a common feedback connection (LDO_fdbk) to the regulator error amplifier 110 when switched into the circuit, but are independently enabled or disabled.

Thus, each of the regulator output devices 114 produces a regulated supply voltage, based on the received bias voltage (LDO_bias), which is regulated for noise rejection, to be fed to a load 120 associated with the regulator output device 114. The voltage at the output of each regulator output device 114 is also the regulated voltage (Vreg) fed to the independent load 120 associated with each regulator output device 114. Accordingly, the regulator output devices 114 regulate power supply to the loads 120 using the bias voltage and the feedback voltage. The example circuit 100 uses a single MOS device 112, as a part of regulator output device 114, to implement a voltage regulation function. The MOS device 112 is shown in FIG. 1 as a PMOS device. Other examples using a complementary configuration may include the use of a NMOS device in this location.

As shown in FIG. 1, the independent loads 120 receive a supply voltage that is regulated for noise rejection. Such regulation may accommodate sensitivity of the components comprising the loads 120 to noise at particular operating frequencies, or the regulation may accommodate other features of the technology of the circuit. For example, the circuit may be implemented using channel length technology that is 65 nanometers or less.

Example power supply circuit 100, as illustrated, is configured such that the independent loads 120 may be switched in and out of the circuit individually. In addition to each regulator output device 114 providing a regulated power supply to an associated load 120, each regulator output device 114 has the ability to switch off that associated load 120 by disconnecting the power supply feeding the load 120. The power supply to the load 120 is switched by each of the associated devices 114 using the respective switches 116, which are operated together. This pair of switches 116 in combination with an associated MOS device 112 completes a regulator output device 114. Each load 120 is switched independently from any of the other loads 120. Further, as illustrated, Enable 1, Enable 2, and Enable n each represent a signal applied to switches 116 to enable and disable the device 114, and therefore switch on and off the associated load 120.

Consequently, each regulator output device 114 is performing a power supply regulation function and an independent switching function for its associated load 120. Further, as shown in FIG. 1, an additional regulator output device 114 may be added to the circuit and employed to perform the functions of power supply regulation and independent switching for an additional independent load 120 that is also added to the circuit, while maintaining equal performance characteristics for each of the loads 120. Deploying a regulator output device 114 for each independent load 120 in the circuit also allows an increase in the power supply to the loads 120 without reducing noise rejection to the loads 120.

In one example, the method and apparatus as illustrated by circuit 100 allows for minimizing the voltage drop between the chip supply that supplies the regulator and the effective regulated supply voltage (Vreg) applied to the load 120, together with a reduction in area consumption by consolidating regulation functions and switching functions into a single device.

Exemplary Implementations

One implementation of the method and apparatus as described above is in supplying power for a digitally controlled ring oscillator that is part of a digital Phase Locked Loop (PLL) circuit.

Figure 2:
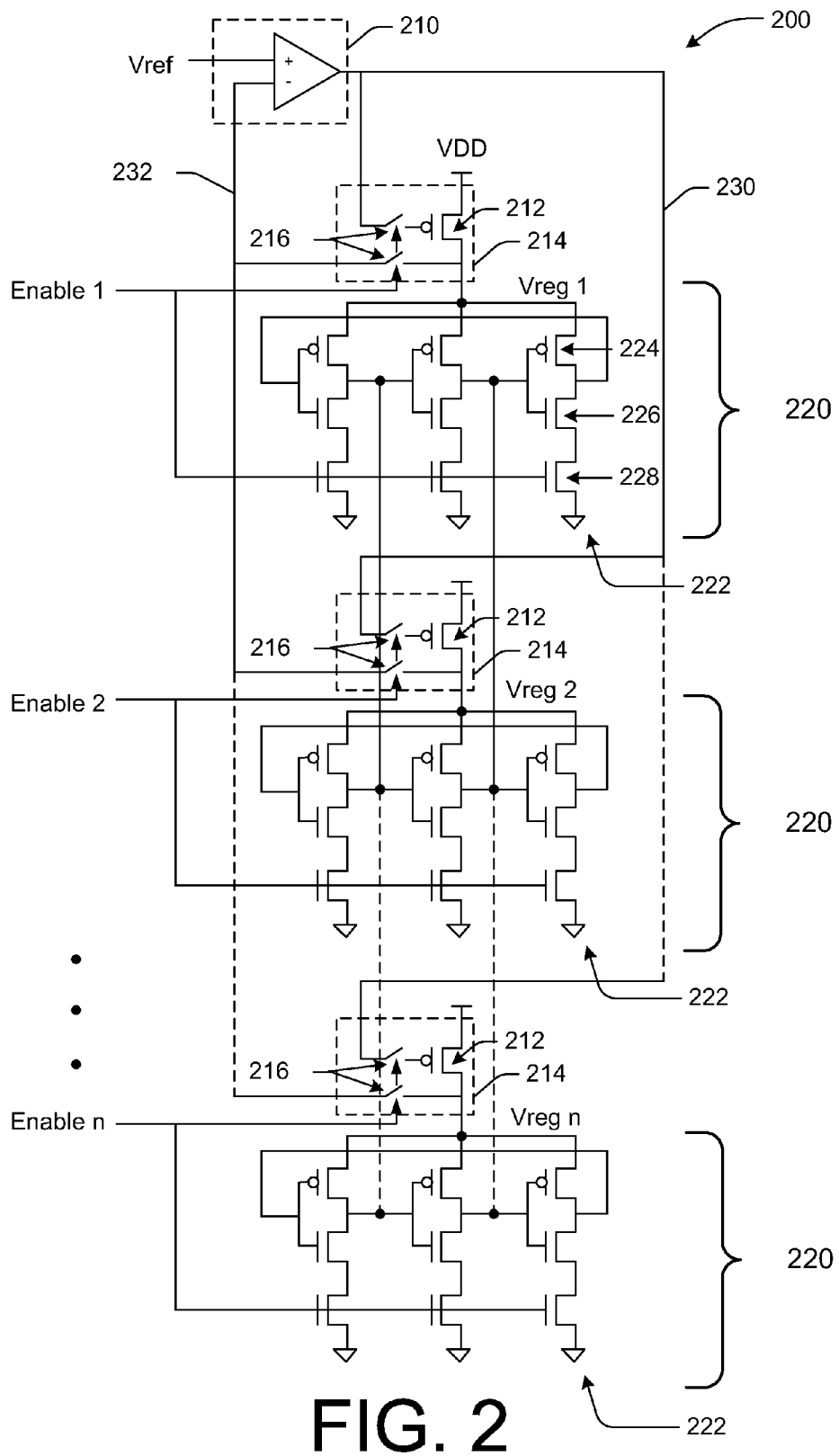
FIG. 2 shows a schematic illustration of an implementation of the apparatus and method according to the present disclosure, the implementation including a digitally controlled ring oscillator.

FIG. 2 shows an example of the method and apparatus employed in supplying power to a digitally controlled ring oscillator 200. In this illustration, the independent loads are multiple ring oscillator stages 220 including tri-state inverters 222 with the upper PMOS switch removed. As shown, any number of ring oscillator stages 220 may be represented by the illustration. For purposes of discussion, each stage 220 is comprised of three tri-state inverters 222 connected in parallel. This is not a limitation, and generally, any odd number of tri-state inverters 222 connected in parallel may be used in a ring oscillator stage 220. The tri-state inverters 222 are connected in a circular loop, so that the output of the last inverter 222 feeds the input of the first inverter 222, creating oscillation between two logical states at each inverter 222 when energized. The oscillation frequency of the digitally controlled ring oscillator is programmed by switching on or off any number of the tri-state inverter stages 220.

As shown in FIG. 2, the LDO regulator error amplifier 210 receives a reference voltage (Vref) on its non-inverting input, and outputs a bias voltage on circuit path 230. This bias voltage is received at the switched input of each of the regulator output devices 214, when the device 214 is enabled. A voltage value is produced at the output of each of the regulator output devices 214 when the device 214 is enabled, based on the value of the bias voltage received by the device 214. The voltage value at the output of each of the regulator output devices 214 is fed back into the inverting input of the LDO regulator error amplifier 210 by way of circuit path 232, when the regulator output device 214 is enabled, to provide error correction feedback to the LDO regulator error amplifier 210. Thus, the voltage value at the output of each of the regulator output devices 214 comprises a power supply regulating function performed by the regulator output device 214. Each of the regulator output devices 214 shares a common bias voltage and a common feedback connection to the regulator error amplifier 210 when switched into the circuit.

Thus, each of the regulator output devices 214 produces a regulated supply voltage, based on the received bias voltage, which is regulated for noise rejection, to be fed to an independent stage 220 associated with the regulator output device 214. The voltage at the output of each regulator output device 214 is also the regulated voltage (Vreg) fed to the independent stage 220 associated with each regulator output device 214. Accordingly, the regulator output devices 214 regulate power supply to the independent stages 220 using the bias voltage and the feedback voltage. The regulator output device 214 uses a single MOS device 212 to implement the voltage regulation function. The MOS device 212 is shown in FIG. 2 as a PMOS device. However, an NMOS device may alternatively be used in this location with a complementary circuit configuration.

Thus, regulated power, including regulation for noise rejection, is supplied to the inverter stages 220 comprising tri-state inverters 222. Ring oscillators built with such tri-state inverters 222 are generally sensitive to supply noise, meaning that a voltage noise is translated into an oscillation frequency noise. In one example, the tri-state inverters 222 may operate at or above 4 GHz. Additionally, in one example, the tri-state inverters 222 are implemented in an electronic circuit using channel length technology that is 65 nanometers or less.

As discussed above, the oscillation frequency of a digitally controlled ring oscillator is programmed by switching on or off any number of the tri-state inverters 222, or inverter stages 220. In the example ring oscillator 200 shown in FIG. 2, the inverter stages 220 are switched on and off by the regulator output device 214. In addition to each regulator output device 214 providing a regulated power supply to an associated inverter stage 220, each regulator output device 214 has the ability to switch off that associated inverter stage 220 by disconnecting the power supply feeding the inverter stage 220. The power supply to the inverter stage 220 is switched by each of the associated devices 214 using the respective switches 216. This pair of switches 216 in combination with an associated MOS device 212 completes a regulator output device 214. Each inverter stage 220 is switched independently from any of the other inverter stages 220. Further, as illustrated, Enable 1, Enable 2, and Enable n each represent a signal applied to switches 216 to enable and disable the device 214, and therefore switch on and off the associated inverter stage 220.

Consequently, each regulator output device 214 is performing a power supply regulation function and an independent switching function for its associated inverter stage 220. Further, as shown in FIG. 2, an additional regulator output device 214 may be added to the circuit and employed to perform the functions of power supply regulation and independent switching for an additional independent inverter stage 220 that is also added to the circuit, while maintaining equal performance characteristics for each of the inverter stages 220. Deploying a regulator output device 214 for each independent inverter stage 220 in the circuit also allows an increase in the power supply to the inverter stage 220 without reducing noise rejection to the inverter stages 220.

As previously discussed, a typical tri-state inverter has normally been comprised of a chain of four MOS devices connected in series: two PMOS devices ahead of two NMOS devices. Generally, the two MOS devices in the center of the chain (one PMOS device and one NMOS device) are the "core" devices, functioning as an inverter, while the two MOS devices on the outer ends of the chain perform switching functions, switching in or out the core inverter devices. Further, as implemented in a ring oscillator circuit, the chain of four MOS devices is generally preceded in the circuit by another PMOS device, functioning as a regulator output device. Regulated power is fed through the PMOS regulator output device, and as a consequence, the core inverter devices of the tri-state inverter receive power through a series of two PMOS devices: a PMOS regulator output device at the output of the low-drop voltage regulator (LDO), and the upper enabling switch of the tri-state inverter.

However, in one implementation, as shown in FIG. 2, only three MOS devices are used in a chain to comprise each tri-state inverter 222. As shown in the illustration, the three devices comprising each tri-state inverter 222 are a PMOS device 224 coupled in series to a first NMOS device 226, which is further coupled in series to a second NMOS device 228. Each of the tri-state inverters 222 in such a ring oscillator circuit is comprised in like manner. The PMOS device 224 and the NMOS device 226 perform the "core" inverter function of the tri-state inverter 222. The NMOS device 228 comprises a switching device for the tri-state inverter 222, enabling and disabling the core devices 224 and 226. Thus, a fourth MOS device found in traditional tri-state inverters, e.g., a PMOS switching device coupled to the core PMOS device 224, is not required in the tri-state inverter 222.

Using only three MOS devices in a chain to comprise each tri-state inverter 222 reduces the voltage drop between the power supplied to the circuit and the effective regulated power supply (represented by Vreg 1, Vreg 2, and Vreg n) applied to the core devices 224 and 226. The switching function that would have been performed by the eliminated PMOS device in each tri-state inverter 222 has been consolidated into the regulator output device 214 associated with each stage 220. Accordingly, the effective regulated power supply (e.g., Vreg n) is fed directly to the two core devices 224 and 226 in each tri-state inverter 222. This shortened path to the core devices 224 and 226 results in a reduced voltage drop from the power supply to the core devices 224 and 226, improving the efficiency of the inverter stage 220. The reduced voltage drop allows for an increase in the driving strength of each tri-state inverter 222, and consequently each stage 220. The increase in driving strength results in a higher attainable stable oscillation frequency of the stage 220. The reduced voltage drop also allows for an increase in current without a reduction in power supply noise rejection as compared to a traditional design. Thus, with the exemplary design, the driving strength of each tri-state stage 220 may be increased while maintaining desired power supply noise rejection.

Further, the exemplary design does not result in greater physical area consumption over traditional designs.

Exemplary Methods

Figure 3:
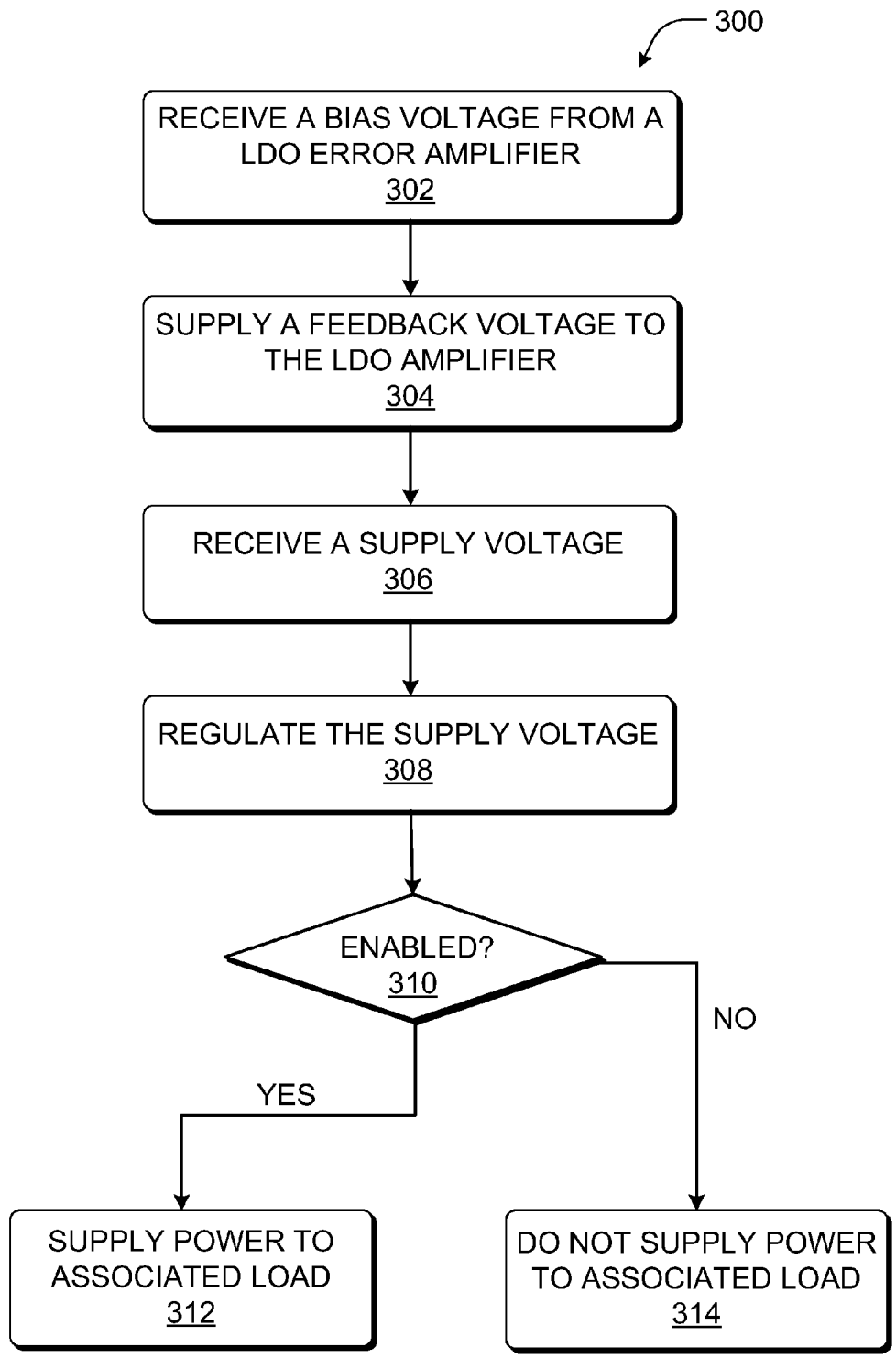
FIG. 3 shows a block diagram of an exemplary method according to the present disclosure.

Exemplary methods 300 according to the above description may be illustrated as shown in FIG. 3. The exemplary methods are illustrated as a collection of blocks in a logical flow graph representing a sequence of operations that can be implemented in electronic circuits. The order in which the methods are described is not intended to be construed as a limitation, and any number of the described method blocks can be combined in any order to implement the methods, or alternate methods. Additionally, individual blocks may be deleted from the methods without departing from the spirit and scope of the subject matter described herein.

At 302, a plurality of semiconductor devices receives a common bias voltage. In one example, the semiconductor devices are metal-oxide-semiconductor (MOS) devices. Further, in the example, the MOS devices are power supply regulator output devices. The common bias voltage is received from a low-dropout voltage regulator (LDO) error amplifier. The plurality of semiconductor devices shares a common bias connection.

At 304, the plurality of semiconductor devices supplies a feedback voltage to the LDO error amplifier. The plurality of semiconductor devices shares a common feedback connection. The feedback voltage supplied to the LDO error amplifier provides error correction to the LDO error amplifier, which causes the bias voltage output by the LDO error amplifier to be adjusted accordingly.

At 306, each of the plurality of semiconductor devices receives a supply voltage at an input to the device. Each of the semiconductor devices receives the same voltage level at its input.

At 308, the supply voltage is regulated by each of the plurality of semiconductor devices, based on the bias voltage received by the plurality of semiconductor devices, in preparation for delivery to an associated load. Each of the plurality of semiconductor devices has a load associated with it.

At 310, a determination is made as to whether each of the plurality of semiconductor devices is enabled or not enabled. If one of the plurality of semiconductor devices is enabled, then at step 312, the one of the plurality of semiconductor devices supplies regulated power to its associated load. If, however, one of the plurality of semiconductor devices is not enabled, then at step 314, the one of the plurality of semiconductor devices does not supply regulated power to its associated load. In one example, supplying regulated power includes regulating the power applied for noise rejection.

The load associated with a semiconductor device may be a load that operates with a regulated power supply and also is switched independently from any other load in the circuit. In one example, the load is one stage of a digitally controlled ring oscillator, the stage comprising an odd number of tri-state inverters connected in parallel. Each of the tri-state inverters may be comprised of a PMOS device coupled to a first n-type MOS (NMOS) device, which is further coupled to a second NMOS device.

In an exemplary implementation, each one of the plurality of semiconductor devices is enabled and disabled independently from the other semiconductor devices.

The method may be implemented on an electronic circuit having a channel length technology not greater than sixty-five nanometers. Additionally, the method may be implemented in conjunction with a digitally controlled ring oscillator. In one example, the digitally controlled ring oscillator oscillates at a frequency of at least four gigahertz.

CONCLUSION

Although the invention has been described in language specific to structural features and/or methodological acts, it is to be understood that the invention is not necessarily limited to the specific features or acts described. Rather, the specific features and acts are disclosed as exemplary forms of implementing the invention.

What is claimed is:

1. A method, comprising:
    receiving a bias voltage provided by a low-dropout voltage regulator (LDO) error amplifier;
    supplying a feedback voltage to the LDO error amplifier;
    supplying a power signal to a load; and
    providing a control signal to enable or disable the load and enable or disable the LDO error amplifier from receiving the feedback voltage.

2. The method according to claim 1, wherein the supplying the power signal act includes regulating the power signal supplied to the load.

3. The method according to claim 2, wherein the regulating the power signal act includes regulating the power signal for noise rejection.

4. The method according to claim 1, wherein the receiving act includes receiving the bias voltage from the LDO error amplifier at a first device, and the supplying the feedback voltage act includes using the first device to supply the feedback voltage to the LDO error amplifier.

5. The method according to claim 4, wherein the supplying the power signal to the load act includes using the first device to supply the power signal to the load.

6. The method according to claim 4, wherein the first device is at least one metal-oxide semi-conductor (MOS) device.

7. The method according to claim 1, wherein the supplying the power signal to the load act includes using a first device to supply the power signal to the load, the method further comprising supplying another power signal to another load using a second device.

8. The method according to claim 7, wherein the supplying the feedback voltage act includes using the first device to supply the feedback voltage to the LDO error amplifier, the method further comprising supplying another feedback voltage to the LDO error amplifier using the second device.

9. The method according to claim 8, wherein the first and second devices are each at least one metal-oxide semi-conductor (MOS) device.

10. An apparatus, comprising:
    a voltage source to provide a bias voltage;
    a first input terminal to receive the bias voltage and a second input terminal to receive a supply voltage;
    an output terminal to supply a feedback voltage and to supply power to a load;
    a switching portion to use a control signal to regulate the first input terminal and the output terminal; and
    a transistor having at least a control terminal and an output terminal, the first input terminal coupled to the control terminal of the transistor and the output terminal coupled to the output terminal of the transistor.

11. The apparatus according to claim 10, wherein the voltage source is to receive the feedback voltage.

12. The apparatus according to claim 10, wherein the voltage source is a low-dropout voltage regulator (LDO) error amplifier.

13. The apparatus according to claim 10, wherein the switching portion is coupled to the first input terminal and further coupled to the output terminal.

14. The apparatus according to claim 10, further comprising:
    a first device, the first and second input terminals and the output terminal associated with the first device; and
    a second device, the second device including a first input terminal to receive the bias voltage, a second input terminal to receive the supply voltage, and an output terminal to supply another feedback voltage and to supply power to another load.

15. The apparatus according to claim 14, further comprising another switching portion coupled to the second device, the another switching portion using another control signal to regulate the first input terminal and to regulate the output terminal of the second device.

16. The apparatus according to claim 14, wherein the first and second devices are each a transistor.

17. A method, comprising:
    supplying a bias voltage from a voltage source;
    receiving the bias voltage;
    receiving a supply voltage;
    supplying a feedback voltage in response to at least receiving the bias voltage, the feedback voltage supplied to the voltage source and a load; and
    simultaneously regulating receiving the bias voltage and supplying the feedback voltage using a control signal.

18. The method according to claim 17, wherein the receiving acts and the supplying of the feedback voltage are performed by a transistor and the simultaneously regulating act is performed on the transistor.

19. The method according to claim 17, wherein the supplying the bias voltage act includes supplying the bias voltage from a low-dropout voltage regulator (LDO) error amplifier.

* * * * *